June 6, 1967 D. J. BOOMGAARD 3,324,412
DUAL MODE OSCILLATOR CIRCUIT WITH PHASE SHIFT CIRCUIT TO PREVENT BAND JUMPING
Filed Aug. 30, 1965
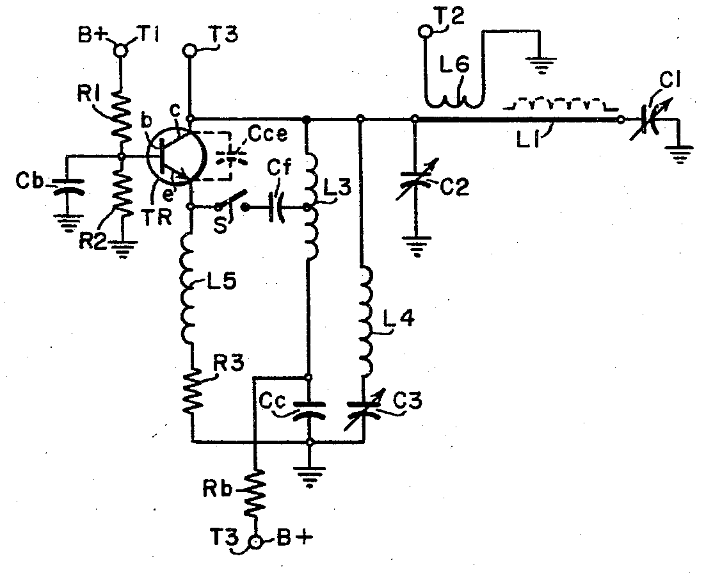
WITNESSES:
Leon M. Garman
James F. Young
INVENTOR
Dirk J. Boomgaard
BY
ATTORNEY 3,324,412

DUAL MODE OSCILLATOR CIRCUIT WITH PHASE SHIFT CIRCUIT TO PREVENT BAND JUMPING

Dirk J. Boomgaard, Murrysville, Pa., assignor to Westinghouse Electric Corporation, Pittsburgh, Pa., a corporation of Pennsylvania Filed Aug. 30, 1965, Ser. No. 483,606
8 Claims. (Cl. 331—117)

The present invention relates to tunable oscillar circuits, and more particularly to tunable oscillator circuits which are tunable to frequencies within at least two bands of frequency.

In television receivers employing both VHF and UHF tuners, separate oscillator circuits are usually necessary to supply the desired heterodyning frequencies to the mixer circuits of the receiver. There is thus an obvious cost disadvantage in requiring separate oscillator circuits to supply the desired tunable frequencies within the VHF and UHF bands. Copending application, Ser. No. 472,179, filed July 15, 1965, and assigned to the same assignee as the present application, describes several dual mode oscillator circuits which permit use of a single oscillator circuit which is tunable to frequencies within both the UHF and VHF frequency bands. Unless dual mode oscillator circuits are carefully designed, band jumping may occur therein. That is, when oscillations are desired at frequencies in the UHF frequency band, for example, the oscillations may jump to the VHF frequency band where the oscillatory conditions may be more satisfactory. It thus becomes necessary to include in the dual mode circuit design features which prevent such band jumping. Also, it is highly desirable to suppress the harmonics of the VHF frequencies when tuning in that band in order to avoid such harmonics appearing in the UHF frequency band, which may cause dual reception, cross talk or other undesirable interference with the desired reception.

It is, therefore, an object of the present invention to provide a new and improved dual mode oscillator circuit which is tunable to frequencies within at least two frequency bands.

It is a further object of the present invention to provide a new and improved dual mode oscillator circuit which is tunable to frequencies within at least two frequency bands and wherein jumping from one band frequency to another is prevented.

It is a still further object of the present invention to provide a new and improved dual mode oscillator circuit which is tunable to frequencies within at least two frequency bands and in which the harmonic content of the freqency being tuned is held to a minimum to avoid interference with the operation of the oscillator circuit.

Broadly, the present invention provides a dual mode tuning circuit which is oscillatory in a first mode to tune to frequencies within a first frequency band and is oscillatory in a second mode to tune to freqencies in a second frequency band, and wherein the jumping from one mode of oscillation to another mode of oscillation is prevented, and wherein harmonics of frequencies within one frequency band are suppressed.

These and other objects and advantages of the present invention will become more apparent when considered in view of the following specification and drawing, in which the single figure is a schematic diagram of the tunable oscillator circuit of the present invention.

Referring to the single figure, the active element for supplying oscillatory energy for the oscillator circuit is a transistor TR, which includes a base electrode *b*, a collector electrode *c*, and an emitter electrode *e*. The transistor TR is biased through a resistor R1 connected between the base *b* of the transistor TR and a terminal T1 to which is connected a source of B+ potential suitable for biasing transistors. A resistor R2 is connected between the base *b* and ground to complete the biasing arrangement. A capacitor C*b* is connected between the base *b* and ground to ground the base with respect to AC signals. The collector electrode *c* of the transistor TR is coupled to a reasonant circuit including a distributed inductive line L1 which has one end connected to the collector. Connected to the other end of the distributed inductive line L1 is a variable capacitor C1 which acts as the main variable tuning element for the oscillator circuit.

For purposes of explanation, the oscillator circuit will be discussed in terms of the VHF and UHF frequency bands. However, it should be understood that other frequency bands could be utilized within the scope of the present invention.

A variable trimmer capacitor C2 is connected at the collector end of the distributed inductive line L1 to ground. The function of the capacitor C2 is to adjust the tuning of the oscillator circuit in the lower end of the UHF band. The distributed line inductor L1, the tuning capacitor C1, the trimmer capacitor C2 thus form the tuning elements of the resonant circuit for tuning in the UHF frequency band, with the capacitor C1 being the main variable element.

Also included in the resonant circuit is an inductive coil L3 which has one end connected to the collector *c* of the transistor TR. The other end is coupled through a by-pass capacitor C*c* to ground. Biasing potential is applied to the collector from a B+ source to be connected at a terminal T3 through a resistor R*b* which is connected to the coil L3. The tuning elements for the VHF frequency band include the inductor L3, capacitors C1 and C2, with the capacitor C1 being the main tuning element for the circuit. In order to permit proper operation of the oscillator at VHF frequencies, the distributed line inductor L1 is so designed to have essentially negligible inductive reactance at VHF frequencies. That is, when tuning is desired at VHF frequencies, the circuit will appear as if one end of the capacitor C1 is directly connected to the VHF coil L3 and the other end of the capacitor C1 is grounded, since the inductor L1 acts as a low resistance non-reactive connection to the capacitor. The inductive line L1, however, is designed to have sufficient inductive reactance at UHF frequencies to supply the necessary tuning inductance for the tuning of the oscillator circuit in the UHF mode of oscillation.

A series combination of an inductor L4 and a capacitor C3, which is variable, is connected between the collector *c* of the transistor TR and ground in order to provide an adjustment for the top end of the VHF band which may be influenced by the adjustment of the capacitor C2 in the UHF band. The inductor L4 and the capacitor C3 are selected to have a series resonant frequency falling within the gap between the UHF and VHF frequency bands. By having such a series resonant frequency above VHF frequencies the series circuit is capacitive, with the magnitude of the capacitive reactance depending primarily upon the capacitor C3. Thus, the VHF band can be adjusted through the capacitor C3. However, in the UHF band, the reactance of the series combination of the inductor L4 and the capacitor C3 is inductive, therefore the effect of adjusting the capacitor C3 is relatively small.

The resonant circuit as described thus preforms the dual function of providing a resonant circuit in both the UHF and the VHF frequency bands. In the UHF band, the resonant circuit comprises mainly the main tuning capacitor C1, the distributed line inductor L1, and the capacitor C2 to adjust the low end of the UHF band. In the VHF frequency band, the distributed inductive line L1 provides very little inductive reactance at these frequencies, and, therefore, a resonant circuit in the VHF band is provided including as the main tuning elements, the tuning capacitor C1, the capacitor C2 and the inductor L3. The series combination circuit of the inductor L4 and the capacitor C3 is included in the resonant circuit to adjust the upper end of the VHF band.

In order to have the oscillator circuit oscillate in a different mode for each of the two frequency bands, it is necessary that the oscillatory criteria be established for the desired mode while the oscillatory conditions are not satisfied for the other mode of oscillation. This is accomplished in the figure as shown with a switch S being connected between the emitter *e* of the transistor TR and a feedback capacitor C*f*. The other end of the feedback capacitor C*f* is connected to the coil L3 to complete a feedback path from the collector to the emitter of the transistor TR through the capacitor C*f* when the switch S is closed. To complete the oscillator circuit, a coil L5 is connected to the emitter electrode of the transistor TR. The other end of the inductor coil L5 is connected through a resistor R3 to ground. The functions of the coil L5 and the resistor R3 will be explained below.

First consider the two oscillatory modes of the oscillator circuit which may be established by opening or closing the switch S. With the switch S open, it will be seen that the oscillator circuit operates as a negative resistance oscillator. It should be noted that the inherent collector to emitter capacitance C*ce*, shown in dotted line in the drawing, is utilized as the feedback capacitor. With the switch S open, the oscillator circuit operating in a negative resistance oscillatory mode, is tunable to frequencies within the UHF frequency band. The tank circuit for the oscillator in the UHF frequency band comprises the tuning capacitor C1, the distributed inductive line L1, and the capacitor C2. By the adjustment of the tuning capacitor C1, various frequencies within the UHF band may thus be generated in the oscillator circuit, and adjustment of the low end of the UHF band is provided through the capacitor C2.

To extract oscillatory energy from the oscillator circuit when operative in the UHF mode, a coil L6 is inductively coupled to the distributed line L1. The coil L6 has one end grounded and the other end connected to a terminal T2 which may be used to supply oscillatory energy to a UHF mixer of the television receiving apparatus.

In order to sustain oscillations when tuning is desired in the VHF frequency band, the switch S is closed to connect the feedback capacitor C*f* to the emitter *e* of the transistor TR. With the switch S closed, it may be seen that the oscillator configuration is now a Hartley oscillator configuration. The oscillator circuit acting as a Hartley oscillator will have a tank circuit comprising the inductor L3 and the capacitors C1 and C2. As previously explained, the line inductor L1 is so designed that they supply very little inductive reactance in the VHF frequency band. Hence, it appears as though the capacitors C1 and C2 are connected directly in parallel across the VHF tuning coil L3. The inductor L4 and capacitor C3 serve to adjust the high end of the VHF frequency band as explained above. Thus, with the oscillator circuit operative as a Hartley oscillator, various frequencies within the VHF frequency band may be tuned with the oscillatory energy taken from a terminal T3 connected at the collector electrode *c* of the transistor TR to be supplied to a VHF mixer of the television receiving apparatus.

It can thus be seen that the oscillator circuit as shown is operative in two modes, namely, (1) the UHF mode, while tuning to frequencies within the UHF frequency band, with the switch S open, and the oscillator circuit operating as a negative resistance oscillator, and (2) the VHF mode, while tuning to frequencies within the VHF frequency band, with the switch S closed, and the oscillator circuit operating as a Hartley oscillator.

It has been found that circuits of the dual mode type have the tendency while oscillating in the UHF frequency band to jump to the VHF frequency band as a negative resistance type oscillator, where at certain VHF frequencies the oscillatory conditions may be more satisfactory. To avoid band jumping in the present case, from the UHF to the VHF frequency bands, the inductor L5 and resistor R3 are connected from the emitter of the transistor TR to ground. The purpose of the inductor L5 and the resistor R3 is to produce a phase shift into the loop including the inherent collector to emitter capacitance C*ce*. The introduction of the phase shift of the inductor L5 makes it impossible for the circuit, with the switch S open, to oscillate in the VHF frequency band. The resistor R3 acts as a bias setting resistor and also aids in establishing the desired phase shift. Thus with the inductor L5 and resistor R3 connected between the emitter and ground, with the switch S open, the only mode of oscillation will be the negative resistance mode, with the UHF band being the most desirable. It will be impossible for the circuit to jump to the VHF frequency band due to the introduction of the inductor L5 in the feedback path of the negative resistance oscillator. It can thus be seen that the present invention advantageously solves the problem of band jumping in dual mode oscillator circuits.

Another important advantage of the oscillator configuration as shown in the figure is that of the very low harmonic content of its oscillations. Harmonics can seriously impair the proper operation of the oscillator especially when harmonics of the VHF frequency appear in the UHF frequency band thereby causing double reception and other interference with proper operation of the oscillator in the VHF frequency band. Harmonics are usually caused by the operation of the active element of the oscillator circuit in its non-linear regions. The present circuit, however, greatly reduces the harmonics of the VHF frequency so that very few harmonics are generated which might interfere with the proper operation of the circuit.

The manner in which the present circuit substantially degenerates harmonics may be seen from the following analysis. Assume that the oscillator circuit is operative in the VHF frequency band, with the switch S closed and the circuit operating as a Hartley oscillator. The oscillations of the circuit of the proper polarity and amplitude are detected in the base-emitter diode of the transistor TR. The detected signals which charge the feedback capacitor C*f* accordingly. The capacitor C*f* in combination with the inductor L5 act at a filter integrating circuit. The bias developed by the integrating circuit tends to drive the transistor TR toward cutoff and thus to be maintained operative in its linear region. Harmonics are prevented from being generated since the bias potential supplied by the integrating circuit keeps the transistor within its linear operating characteristics. The time constant of the integrating circuit including the inductor L5 and the capacitor C*f* is so selected to be sufficiently longer than the period of the oscillatory frequency in the VHF band so that the bias developed in the integrating circuit will maintain the transistor TR in its linear region. In test results, it has been shown that improvements in harmonic content of oscillations in the VHF band of at least 100 to 1 have been obtained over oscillator circuits without the integrating filter arrangement.

Although the present invention has been described with a certain degree of particularity, it should be understood that the present disclosure has been made only by way of example and that numerous changes in the details of construction and fabrication and in the combination and arrangement of parts, elements and components can be restored to without departing from the spirit and the scope of the present invention.

I claim as my invention:

1. An oscillator circuit operative to oscillate in at least two modes of oscillation and tunable to frequencies within at least two frequency bands comprising: an amplifying element having an input and output and operative to supply oscillatory energy for said oscillator circuit; variable tuning capacitance means for tuning to frequencies within each of said frequency bands; first inductance means operatively connected between said output and said tuning capacitance means to provide tuning inductance at frequencies within a first of said frequency bands and substantially no tuning inductance at frequencies within a second of said frequency bands; second inductance means operatively connected to said output and operative to provide tuning inductance at frequencies within the second of said frequency bands; control means operatively connected between said inductance means and said input for selecting the desired mode of oscillation of said oscillator circuit so that said oscillator circuit will oscillate in a first mode of oscillation and be tunable to frequencies within said first band of frequencies and will oscillate in a second mode and be tunable to frequencies in said second band; and phase shifting means operatively connected between said input and said second inductance means to prevent oscillation of said oscillator in an undesired band when oscillation is desired in another of said bands, said amplifying element, said control means and said phase shift means being operative to prevent harmonics of a given of said bands of frequencies from being generated.

2. The oscillator circuit of claim 1 wherein: a time constant circuit being formed including said phase shift means to control the operating level of said amplifying element so that harmonics of the oscillatory frequency of said oscillator circuit are suppressed.

3. An oscillator circuit operative to oscillate in at least two modes of oscillation and tunable to frequencies within at least two frequency bands comprising: an active device including a plurality of electrodes and operative to supply oscillatory enrgy for said oscillator circuit; a variable tuning capactor for tuning to frequencies within each of said frequency bands; first inductor means operatively connected between a first of said electrodes and said capacitor to provide tuning inductance at frequencies within a first of said frequency bands and substantially no tuning inductance at frequencies within a second of said frequency bands; second inductor means operatively connected to the first of said electrodes and operative to provide tuning inductance at frequencies within the second of said frequency bands; control means for selecting the desired mode of oscillation of said oscillator circuit including a feedback capacitor and switching means operatively connected to said feedback capacitor, said switching means and feedback capacitor operatively connected between the first and a second of said electrodes so that when said switching means is placed in a first state said oscillator circuit will oscillate in a first mode of oscillation and be tunable to frequencies within said first band of frequencies and with said switching placed in a second state will oscillate in a second mode and be tunable to frequencies in said second band; and phase shift means operatively connected to the second of said electrodes to prevent oscillation of said oscillator in one of said bands when oscillation is desired in another of said bands; a time constant circuit being formed including said feedback capacitor and said phase shift means to control said device so that harmonics of the oscillatory frequency are suppressed.

4. An oscillator circuit operative to oscillate in at least two modes of oscillation and tunable to frequencies within at least two frequency bands comprising: a transistor means including base, collector and emitter electrodes and operative to supply oscillatory energy for said oscillator circuit; resonant circuit means operatively connected to the collector electrode of said transistor to receive energy therefrom, said resonant circuit means including a variable tuning capacitor for tuning to frequencies within each of said frequency bands, a distributed line inductor operatively connected between said collector and said capacitor to provide tuning inductance at frequencies within a first of said frequency bands and substantially no tuning inductance at frequencies within a second of said frequency bands, and a second inductor operatively connected to said collector and operative to provide tuning inductance at frequencies within the second of said frequency bands; control means operatively connected between said collector and emitter electrodes for selecting the desired mode of oscillation of said oscillator circuit so that said oscillator circuit will oscillate in a first mode of oscillation and be tunable to frequencies within said first band of frequencies and will oscillate in a second mode and be tunable to frequencies in said second band; and phase shift means operatively connected to said emitter electrode to prevent the jumping of said oscillator circuit from oscillation in a desired band to oscillation in an undesired band; and integrating means including said phase shift means operatively connected to said emitter electrode to bias said transistor to operate in its linear region so that harmonics of the oscillatory frequency of said oscillator circuit are suppressed.

5. An oscillator circuit operative to oscillate in at least two modes of oscillation and tunable to frequencies within at least two frequency bands comprising: a semiconductor device including a plurality of electrodes and operative to supply oscillatory energy for said oscillator circuit; resonant circuit means operatively connected to a first of said electrodes of said semiconductor device to receive energy therefrom, said resonant circuit means including a variable tuning capacitor for tuning to frequencies within each of said frequency bands, a distributed line inductor operatively connected between the first of said electrodes and said capacitor to provide tuning inductance at frequencies within a first of said frequency bands and substantially no tuning inductance at frequencies within a second of said frequency bands and a second band inductor operatively connected to the first of said electrodes and operative to provide tuning inductance at frequencies within the second of said frequency bands; control means for selecting the desired mode of oscillation of said oscillator circuit including a feedback capacitor and a switch operatively connected to said feedback capacitor, said switch and feedback capacitor operatively connected between the first and a second of said electrodes so that when said switch is placed in a first state said oscillator circuit will oscillate in a first mode of oscillation and be tunable to frequencies within said first band of frequencies and with said switch is placed in a second state will oscillate in a second mode and be tunable to frequencies in said second band; and a phase shift inductor operatively connected to the second of said electrodes to prevent oscillation of said oscillator in said second band when oscillation is desired in said first band; and a biasing circuit operatively connected to the second of said electrodes and including said phase shift inductance means to bias said semiconductive device so that harmonics of the oscillatory frequency of said oscillator circuit are suppressed.

6. An oscillator circuit operative to oscillate in at least two modes of oscillation and tunable to frequencies within at least two frequency bands comprising: a transistor including base, collector and emitter electrodes and operative to supply oscillatory energy for said oscillator circuit; resonant circuit means operatively connected to the collector electrode of said transistor to receive energy therefrom, said resonant circuit means including a variable tuning capacitor for tuning to frequencies within each of said frequency bands, a distributed line inductor operatively connected between said collector and said capacitor to provide tuning inductance at frequencies within a first of said frequency bands and substantially no tuning inductance at frequencies within a second of said frequency bands, and a second band inductor operatively connected to said collector and operative to provide tuning inductance at frequencies within the second of said frequency bands; control means for selecting the desired mode of oscillation of said oscillator circuit including a feedback capacitor and a switch operatively connected to said feedback capacitor, said switch and feedback capacitor operatively connected between said collector and said emitter electrodes so that when said switch is opened said oscillator circuit will oscillate in a first mode of oscillation and be tunable to frequencies within said first band of frequencies and with said switch closed will oscillate in a second mode and be tunable to frequencies in said second band; and a phase shift inductor operatively connected to said emitter electrode to prevent oscillation of said oscillator in said second band when oscillation is desired in said first band, a time constant circuit being formed including said phase shift inductor to suppress harmonics of said second band of frequencies from appearing in said first band of frequencies.

7. An oscillator circuit for use in a television receiver operative to oscillate in at least two modes of oscillation and tunable to frequencies within the UHF and VHF frequency bands comprising: a transistor including base, collector and emitter electrodes and operative to supply oscillatory energy for said oscillator circuit; a variable tuning capacitor for tuning to frequencies within each of said frequency bands; a distributed line inductor operatively connected between said collector and said tuning capacitor to provide tuning inductance at frequencies within the UHF frequency band to tune said oscillator circuit in cooperation with said tuning capacitor to frequencies within the UHF frequency band and to provide substantially no tuning inductance at frequencies within the VHF frequency band; a VHF tuning inductor operatively connected to said collector and operative to provide tuning inductance at frequencies within the VHF frequency band to tune said oscillator circuit to frequencies within the VHF frequency band; control means for selecting the desired mode of oscillation of said oscillator circuit including a feedback capacitor and a switch operatively connected to said feedback capacitor, said switch and feedback capacitor operatively connected between said collector and said emitter electrodes so that when said switch is opened said oscillator circuit will oscillate in a first mode of oscillation and be tunable to frequencies within the UHF band of frequencies and with said switch closed will oscillate in a second mode and be tunable to frequencies in the VHF band of frequencies; and a series circuit including a phase shift inductor and a resistor operatively connected between said emitter electrode and a reference potential to prevent oscillation of said oscillator in said second band of oscillation when oscillation is desired in said first band of oscillation by introducing a phase shift unsuitable to sustain oscillations in the undesired band, said feedback capacitor and said phase shift inductor forming a time constant circuit when said oscillator circuit is operative in said second mode of oscillation so that a bias potential is developed in said time constant circuit in response to the signals being detected by the base-emitter diode of said transistor, with said bias potential maintaining said transistor in its linear portion of operation so that harmonics of the oscillatory VHF frequency are substantially suppressed to avoid interferring frequencies being generated in the UHF frequency band.

8. An oscillator circuit for use in a television receiver operative to oscillate in at least two modes of oscillation and tunable to frequencies within the UHF and VHF frequency bands comprising: a transistor including base, collector and emitter electrodes and operative to supply oscillatory energy for said oscillator circuit; a variable tuning capacitor for tuning to frequencies within each of said frequency bands; a distributed line inductor operatively connected between said collector and said tuning capacitor to provide tuning inductance at frequencies within the UHF frequency band to tune said oscillator circuit in cooperation with said tuning capacitor to frequencies within the UHF frequency band and to provide substantially no tuning inductance at frequencies within the VHF frequency band; a VHF tuning inductor operatively connected to said collector and operative to provide tuning inductance at frequencies within the VHF frequency band to tune said oscillator circuit to frequencies within the VHF frequency band; a trimmer capacitor operatively connected to said distributed inductive line for adjusting the low end of the UHF frequency band; a series resonant circuit operatively connected to the collector electrode of said transistor for adjusting the high end of the VHF frequency band; control means for selecting the desired mode of oscillation of said oscillator circuit including a feedback capacitor and a switch operatively connected to said feedback capacitor, said switch and feedback capacitor operatively connected between said collector and said emitter electrodes so that when said said switch is opened said oscillator circuit will oscillate in a first mode of oscillation and be tunable to frequencies within the UHF band of frequencies and with said switch closed will oscillate in a second mode and be tunable to frequencies in the VHF band of frequencies; and a series circuit including a phase shift inductor and a resistor operatively connected between said emitter electrode and a reference potential to prevent oscillation of said oscillator in said second band of oscillation when oscillation is desired in said first band of oscillation by introducing a phase shift unsuitable to sustain oscillations in the undesired band, said feedback capacitor and said phase shift inductor forming a time constant circuit when said oscillator circuit is operative in said second mode of oscillation so that a bias potential is developed in said time constant circuit in response to the signals being detected by the base-emitter diode of said transistor, with said bias potential maintaining said transistor in its linear portion of operation so that harmonics of the oscillatory VHF frequency are substantially attenuated to avoid interfering frequencies being generated in the UHF frequency band.

References Cited

UNITED STATES PATENTS

| | | | |
|---|---|---|---|
| 2,525,053 | 10/1950 | Vilkomerson | 331—59 |
| 2,571,001 | 10/1951 | Anderson | 331—59 |
| 3,252,096 | 5/1966 | Carlson | 331—96 |

ROY LAKE, *Primary Examiner.*

J. KOMINSKI, *Assistant Examiner.*